United States Patent
Shim et al.

(10) Patent No.: US 8,247,962 B2
(45) Date of Patent: Aug. 21, 2012

(54) ORGANIC LIGHT EMITTING DEVICE AND MANUFACTURING METHOD THEREOF

(75) Inventors: Jong-Youp Shim, Anyang-si (KR); Jun-Ho Jeong, Daejeon (KR); Ki-Don Kim, Seoul (KR); Dae-Geun Choi, Daejeon (KR); Jun-Hyuk Choi, Daejeon (KR); Eung-Sug Lee, Daejeon (KR); So-Hee Jeon, Seoul (KR); Jae-R Youn, Seoul (KR); Jang-Joo Kim, Seoul (KR)

(73) Assignee: Korea Institute of Machinery & Materials, Jang-Dong, Youseong-Ku, Daejeon (KR)

( * ) Notice: Subject to any disclaimer, the term of this patent is extended or adjusted under 35 U.S.C. 154(b) by 189 days.

(21) Appl. No.: 12/273,654

(22) Filed: Nov. 19, 2008

(65) Prior Publication Data

US 2009/0128022 A1    May 21, 2009

(30) Foreign Application Priority Data

Nov. 21, 2007   (KR) .................. 10-2007-0119089

(51) Int. Cl.
  *H01L 51/50* (2006.01)
(52) U.S. Cl. ....................................... 313/504
(58) Field of Classification Search .................. 313/512, 313/503, 504
  See application file for complete search history.

(56) References Cited

U.S. PATENT DOCUMENTS

| 2002/0030442 A1* | 3/2002 | Koyama et al. ........... 313/504 |
| 2003/0057417 A1* | 3/2003 | Lee et al. .................. 257/40 |
| 2004/0119688 A1* | 6/2004 | Troxell et al. ............. 345/156 |
| 2006/0072642 A1* | 4/2006 | Wang et al. ............... 372/50.1 |

FOREIGN PATENT DOCUMENTS

| JP | 2005-141921 A | 6/2005 |
| JP | 2007-287486 A | 11/2007 |
| KR | 10-2003-0026450 A | 4/2003 |
| KR | 10-2003-0093515 A | 12/2003 |
| KR | 10-2006-0030395 A | 4/2006 |
| KR | 10-2006-0030396 A | 4/2006 |

OTHER PUBLICATIONS

Kunlaki Ishihara, et al., Organic light-emitting diodes with photonic crystals on glass substrate fabricated by nanoimprint lithography, Applied Physics Letters vol. 90 p. 111114.

* cited by examiner

*Primary Examiner* — Anh Mai
*Assistant Examiner* — Hana Featherly
(74) *Attorney, Agent, or Firm* — Lexyoume IP Meister, PLLC

(57) ABSTRACT

An organic light emitting device having a photonic crystal structure and a manufacturing method thereof are provided. The organic light emitting device comprises: a substrate through which light passes; a photonic crystal layer formed on the substrate and having a photonic crystal structure; an intermediate layer formed on the photonic crystal layer and having a large refractive index compared with the photonic crystal layer; a first electrode layer formed on the intermediate layer; a light emitting layer formed on the first electrode layer and emitting light according to current flow; and a second electrode layer formed on the light emitting layer.

12 Claims, 12 Drawing Sheets

Spin-coating

ORGANIC LIGHT EMITTING DEVICE AND MANUFACTURING METHOD THEREOF

CROSS-REFERENCE TO RELATED APPLICATION

This application claims priority to and the benefit of Korean Patent Application No. 10-2007-0119089 filed in the Korean Intellectual Property Office on Nov. 21, 2007, the entire content of which is incorporated herein by reference.

BACKGROUND OF THE INVENTION (a) Field of the Invention

The present invention relates to an organic light emitting device which can improve optical efficiency by having a photonic crystal structure, and a manufacturing method thereof.

(b) Description of the Related Art

Organic light emitting devices (OLEDs) are self-luminescent devices that emit light when electrons and holes are combined in a fluorescent or phosphor organic layer when current flows to the fluorescent or phosphor organic layer. OLEDs can be manufactured to be lightweight using less number of components through a simple manufacturing process, and can provide high-quality images and wide-view angles.

In an OLED, the external light emission efficiency becomes a standard for deciding the light emission efficiency of a product. The external light emission efficiency of the OLED is determined by the internal quantum efficiency and the optical coupling efficiency. The internal quantum efficiency is determined by the nonradiative recombination loss and the singlet-triplet branching ratio. The internal quantum efficiency can be improved to 80% experimentally. On the contrary, it is recognized that the optical coupling efficiency is improved to 20% because it is relatively quite low compared with the internal quantum efficiency. Accordingly, the research to improve optical coupling efficiency is under way, and the development of related technologies is steadily progressing.

A total reflection occurring at an interface of each layer of the organic light emitting device is a major factor lowering the optical coupling efficiency. The organic light emitting device is formed of a plurality of air layers. The total reflection occurs mostly at interfaces of the air layers. Conventionally, there are various known techniques for preventing total reflection and improving optical coupling efficiency.

Conventionally, there are known a method for patterning a silica microsphere on a substrate, a method for patterning a microlens on the back surface of a substrate, and a method for patterning a photonic crystal structure on a substrate by an etching process. Such techniques improve optical coupling efficiency by scattering light at a substrate or at an interface of each air layer. In the techniques that have been thusly studied and reported or known, light emission efficiency is improved by forming a pattern of nanometer size. However, these known techniques are the result of the experiment carried out on samples of areas of several mm size in order to form a nanometer size pattern. Therefore, in the case of actually manufacturing an organic light emitting device product, it is difficult to form a nanometer level pattern, and its manufacturing cost is high.

In addition, conventionally, there is known a result of improving light emission efficiency by using an AAO (Anodic Aluminum Oxide) film having holes of 400-450 nm. However, the method using an AAO film has a number of problems including difficulty of manufacturing a large-area thin film and low productivity. Moreover, the process using an AAO film is problematic in that it is difficult to apply the process to a plastic substrate.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been proposed to solve the foregoing problems of the prior art, and to provide an organic light emitting device which is improved in optical efficiency compared with the conventional one.

Additionally, the present invention provides a manufacturing method of an organic light emitting device which enables mass production and manufactures a large-area organic light emitting device compared with the conventional art.

An organic light emitting device according to an exemplary embodiment of the present invention comprises: a substrate through which light passes; a photonic crystal layer formed on the substrate and having a photonic crystal structure; an intermediate layer formed on the photonic crystal layer and having a large refractive index compared with the photonic crystal layer; a first electrode layer formed on the intermediate layer; a light emitting layer formed on the first electrode layer and emitting light according to current flow; and a second electrode layer formed on the light emitting layer.

The refractive index of the photonic crystal layer may be smaller than or equal to that of the substrate. The photonic crystal layer may be made of a polymer, and the substrate may be flexible.

The refractive index of the intermediate layer may be larger than or equal to that of the first electrode. The intermediate layer may be made of one material selected from the group of oxides and nitrides. That is to say, the intermediate layer may be made of one or more materials selected from the group consisting of SiNx, $Si_3N_4$, $TiO_2$, MgO, ZnO, $Al_2O_3$, $SnO_2$ and $In_2O_3$.

The organic light emitting device may further include an even portion coated with a sol-gel solution on the intermediate layer, and the first electrode layer may be stacked on the even portion.

The photonic crystal structure may form a square lattice structure or triangular lattice structure by having a plurality of photonic crystal unit patterns regularly arranged thereon. The shape of the photonic crystal unit patterns may be one of a cylinder, a trigonal pyramid, and a square pyramid.

The first electrode layer may be made of a transparent conducting oxide (TCO) material.

A manufacturing method of an organic light emitting device according to an exemplary embodiment of the present invention comprises: forming a photonic crystal layer on a substrate; forming an intermediate layer on the photonic crystal layer; and sequentially forming a first electrode layer, a light emitting layer, and a second electrode layer on the intermediate layer. The forming of a photonic crystal layer comprises: applying the material of the photonic crystal layer on the substrate; and forming a photonic crystal by imprinting the material of the photonic crystal layer by using a mask having an inverted surface shape of the photonic crystal structure.

In the forming of a photonic crystal layer, the mask may be pressed and heated after applying a polymer resin to the surface of the substrate and hardening the same in the imprinting, thereby forming a photonic crystal layer. Alternatively, in the forming of a photonic crystal layer, in a state that the polymer resin in liquid form is applied to the surface of the substrate and pressed by the mask in the imprinting, the polymer resin may be hardened by irradiating ultraviolet rays, thereby manufacturing a photonic crystal structure.

The forming of an intermediate layer comprises: dropping a sol-gel solution onto the photonic crystal layer; and spin-coating the sol-gel solution by spinning the substrate. At this moment, in the forming of an intermediate layer, crystallization may be induced by heating the sol-gel solution after spinning the substrate at 1,000-4,000 rpm in the spin-coating.

The forming of an intermediate layer may use any of chemical vapor deposition (CVD), plasma enhanced chemical vapor deposition, evaporating deposition, and sputtering.

The organic light emitting device according to the exemplary embodiment of the present invention has a merit that the light emission efficiency is relatively high compared with the conventional one by having a photonic crystal structure and reducing total reflection due to difference in refractive index.

Additionally, the manufacturing method of an organic light emitting device according to the exemplary embodiment of the present invention can mass-produce a large-area organic light emitting device at a relatively low cost compared with the conventional art by using a nanoimprint process and a sol-gel method.

DESCRIPTION OF REFERENCE NUMERALS INDICATING PRIMARY ELEMENTS IN THE DRAWINGS

Figure 1:
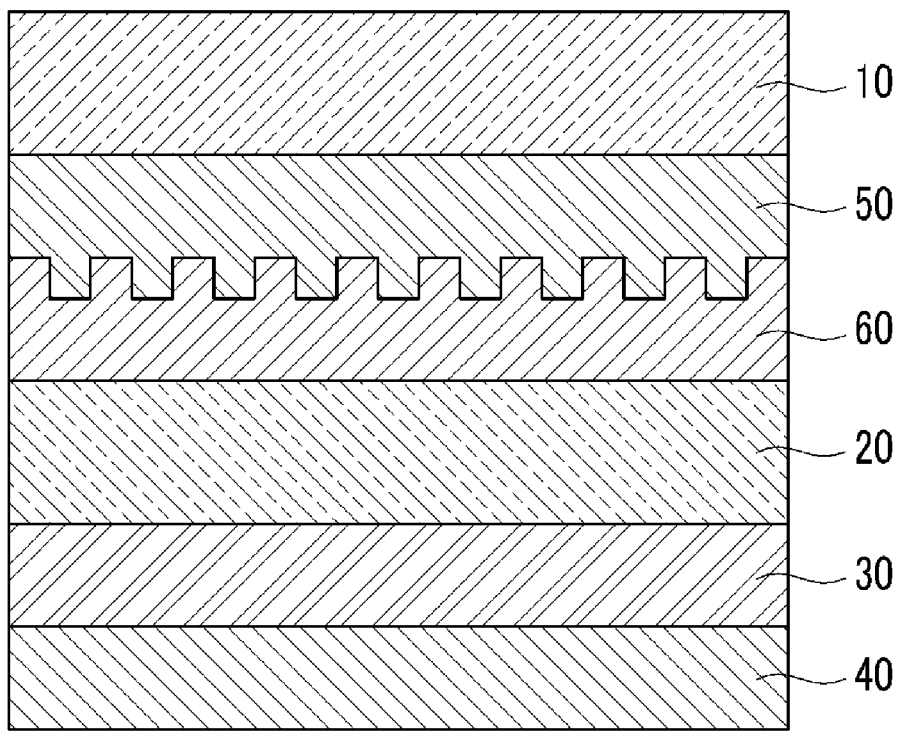
FIG. 1 is a cross sectional view of an organic light emitting device according to an exemplary embodiment of the present invention.

10: substrate
20: first electrode layer
30: light emitting layer
40: second electrode layer
50: photonic crystal layer
51: photonic crystal
60: intermediate layer
100: mask
200: sol-gel injector

DETAILED DESCRIPTION OF THE EMBODIMENTS

Hereinafter, exemplary embodiments of the present invention will be described in detail with reference to the accompanying drawings so that those skilled in the art can readily carry out the invention. As those skilled in the art would realize, the described embodiments may be modified in various different ways, all without departing from the spirit or scope of the present invention.

FIG. 1 is a cross sectional view of an organic light emitting device according to an exemplary embodiment of the present invention.

As shown in FIG. 1, the organic light emitting device OLED according to this exemplary embodiment comprises, as basic components, a substrate 10, a first electrode 20, a light emitting layer 30, and a second electrode layer 40. Particularly, the organic light emitting device according to this exemplary embodiment comprises a photonic crystal layer 50 having a photonic crystal layer for preventing internal reflection of light due to difference in refractive index between the substrate 10 and the first electrode 20 and an intermediate layer for supplementing the electrical characteristic of the first electrode layer.

The substrate 10 is a transparent substrate which externally diffuses light generated in the organic light emitting device. A glass substrate is generally used as the substrate 10, and its refractive index is about 1.5. The transparent substrate may be a crystalline quartz substrate or an amorphous glass substrate. In addition, the transparent substrate may be a sapphire ($Al_2O_3$) substrate or a plastic substrate.

The first electrode layer 20 is laminated on one surface of the intermediate layer 60 after the photonic crystal layer 50 and the intermediate layer 60 are formed on the substrate 10. The first electrode layer 20 is a transparent conducting oxide (TCO) material, is generally made of an ITO (Indium Tin Oxide) material, and its refractive index is about 1.9. The first electrode layer 20 is referred to as a positive (+) electrode.

The light emitting layer 30 is an organic emission layer (EML), and is laminated on one surface of the first electrode layer 20. When current flows from the first electrode layer 20 serving as a positive electrode to the second electrode layer 40 serving as a negative electrode, electrons and holes are coupled at the light emitting layer 30. Due to this, the light emitting layer 30 causes self light emission by which light is generated.

The second electrode layer 40 is laminated on one surface of the light emitting layer 30. The second electrode layer 40 is made of a metal material, serves as a negative (−) electrode, and is also referred to as a cathode layer.

Figure 2:
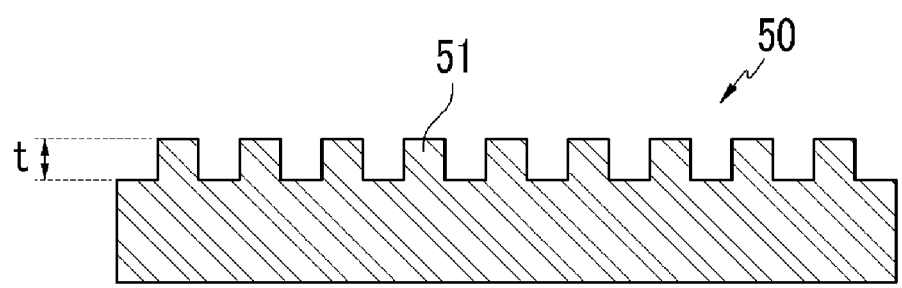
FIG. 2 is a cross-sectional view showing a photonic crystal layer shown in FIG. 1.

The photonic crystal layer 50 is laminated on one surface of the substrate 10, and, as shown in FIG. 2, has a photonic crystal 51 structure. The photonic crystal 51 is a structure for forming a photonic band gap (wavelength band of light that cannot pass through the photonic crystal structure, and is arranged in a regular structure. The photonic crystal 51 includes a region which light of a specific wavelength range cannot permeate or which is lost upon reflection. For similar reason, reflection of light inside the organic light emitting device is reduced, thereby improving light emission efficiency. The photonic crystal 51 structure will be explained in more detail below.

The photonic crystal layer 50 is made of a polymer. Therefore, the photonic crystal layer 50 can be applied to a flexible substrate as well as a glass substrate. The lower the refractive index of the photonic crystal layer 50 is than the refractive index of the intermediate layer 60, the higher the light emission efficiency is due to the photonic crystal 51 layer. However, the lower the refractive index of the photonic crystal layer 50, the greater the diffraction of light. In order to prevent additional total reflection, the refractive index of the photonic crystal layer 50 is preferably equal to or lower than the refractive index of the substrate 10. The photonic crystal layer 50 has a permeation rate conforming to that of the substrate 10.

As the intermediate layer 60 is laminated on one surface of the photonic crystal layer 50, it has a higher refractive index than that of the photonic crystal layer 50. The conductivity and electrical characteristics of the first electrode layer 20 is affected much by its surface shape. By the way, as explained above, the surface shape of the photonic crystal layer 50 is not even due to the photonic crystal 51. Due to this, when the photonic crystal layer 50 and the first electrode layer 20 come into direct contact with each other, this may cause a lot of leakage current. The intermediate layer 60 is formed between the photonic crystal layer 50 and the first electrode layer 20, and plays the role of suppressing current generation.

The intermediate layer 60 is made of one or more materials selected from the group of oxides and nitrides. That is to say, the intermediate layer 60 is made of a material belonging to the group of oxides and nitrides, such as SiNx, $Si_3N_4$, $TiO_2$, MgO, ZnO, $Al_2O_3$, $SnO_2$, and $In_2O_3$. Particularly, ZnO used as the material of the intermediate layer 60 is in contact with the first electrode layer 20 made of an ITO material to cause the electrical characteristics to be properly exhibited.

The higher the refractive index of the intermediate layer 60 becomes, the higher the light emission efficiency becomes by means of the photonic crystal structure. However, the lower the refractive index of the intermediate layer 60, the greater the diffraction of light. In order to prevent additional total reflection, the refractive index of the intermediate layer 60 is preferably equal to or lower than the refractive index of the first electrode layer 20.

In this way, in the organic light emitting device, diffraction or scattering of light is caused due to difference in refractive index between the photonic crystal layer 51 and the photonic crystal layer 50. Due to this, in the organic light emitting device, total reflection of light is reduced, and the efficiency of external light emission toward the substrate is further improved. In addition, optimum light emission efficiency, light intensity distribution in a far field, or light intensity distribution according to observation angle determines the thickness of each air layer and the parameters of the photonic crystal layer by applying a simulation technique. The parameters of the photonic crystal 51 structure are explained below with reference to FIGS. 3A to 3D.

FIGS. 3A to 3D are plan views respectively showing the arrangement structures and unit patters of photonic crystals which may be formed on the photonic crystal layer shown in FIG. 1.

As shown in FIGS. 3A to 3D, structures of photonic crystals 51, 52, and 53 are representative examples, and the following various structures can be employed.

Figure 3A:
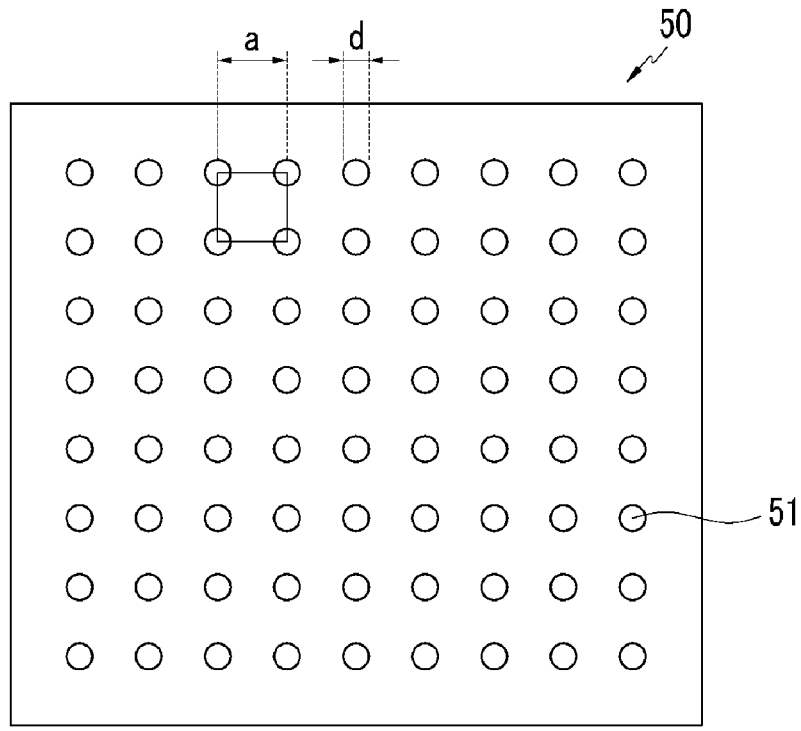
FIGS. 3A to 3D are plan views respectively showing the arrangement structures and unit patterns of photonic crystals which may be formed on the photonic crystal layer shown in FIG. 1.
Figure 3B:
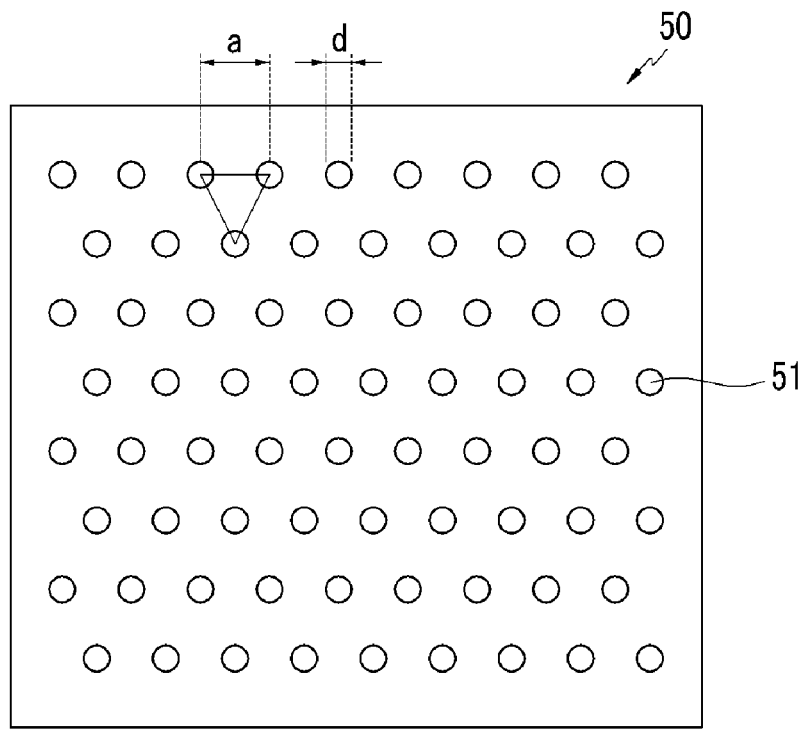
Figure 3C:
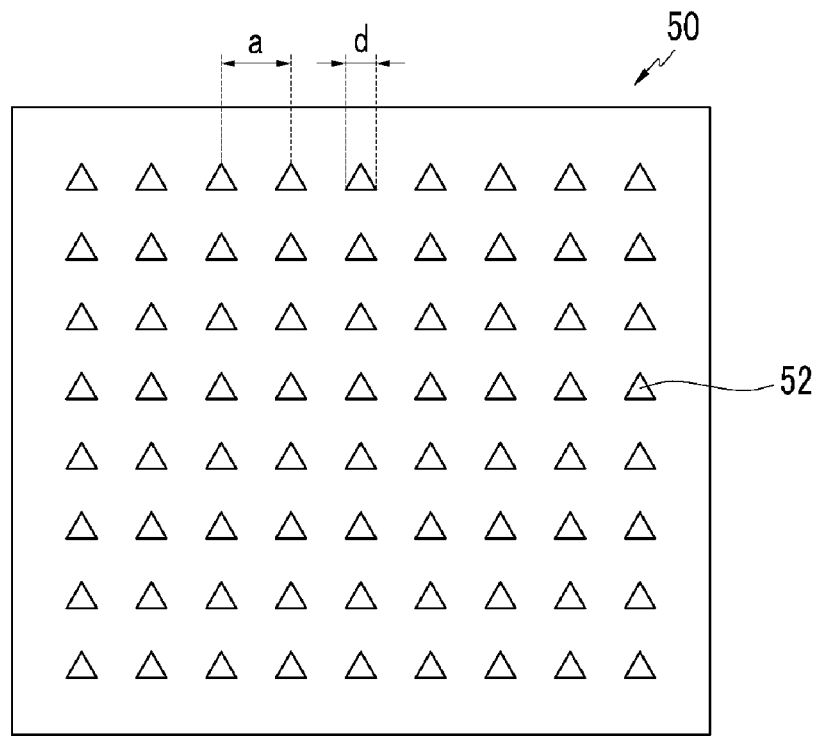
Figure 3D:
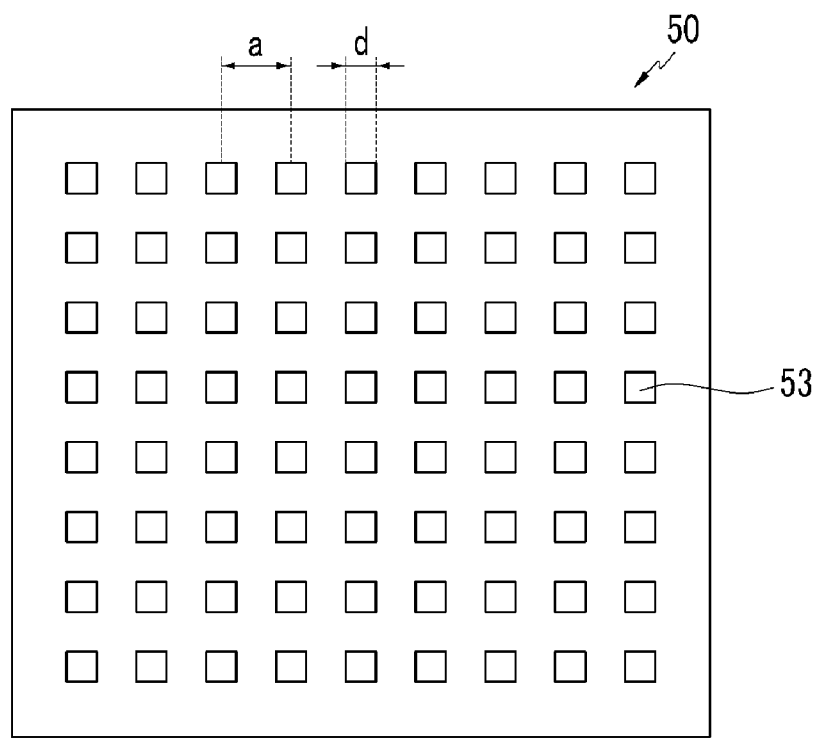

A plurality of unit patterns of the photonic crystal 51 as shown in FIG. 3A are regularly arranged to form a square lattice structure, and has a cylindrical shape. The unit patterns of the photonic crystal 51 shown in FIG. 3B also have a cylindrical shape, and are regularly arranged. However, the plurality of unit patterns of the photonic crystal 51 shown in FIG. 3B have a lattice structure in which they are arranged in a triangular shape. The unit patterns of the photonic crystal 52 shown in FIG. 3C form a square lattice structure as they have a trigonal pyramid shape and are regularly arranged. The unit patterns of the photonic crystal 53 shown in FIG. 3D form a square lattice structure as they have a square pyramid shape and are regularly arranged. Besides, the unit patterns of the photonic crystals may have a triangular lattice structure while having a trigonal pyramid or square pyramid shape.

In FIGS. 3A to 3D, reference numeral A is a distance between the unit patterns of the photonic crystals 51, 52, and 53, and reference numeral D is a representative length of the unit patterns of the photonic crystals 51, 52, and 53. If the unit patterns of the photonic crystal 51 have a cylindrical shape, the representative length D of the unit patterns of the photonic crystals 51, 52, and 53 means the diameter thereof. If the unit patterns of the photonic crystal 51 have a trigonal pyramid shape or square pyramid shape, the representative length D of the unit patterns of the photonic crystals 51, 52, and 53 means the length of one side. In addition, reference numeral T of FIG. 2 means the height of the unit patterns of the photonic crystal 51. Moreover, light emission efficiency, light intensity distribution in a far field, or light intensity distribution according to observation angle are determined in accordance with the parameters A, D, and T and shapes of the structures of the photonic crystals 51, 52, and 53. That is to say, when the distance A, height T, or representative length D between the photonic crystals is changed, the degree of diffraction and scattering of light is changed. In this manner, from the viewpoint of diffraction optics, the more the diffraction and scattering of light occurs, the higher the optical efficiency of the organic light emitting device becomes.

However, as a result of an experiment carried out by applying a plurality of simulation techniques, the distance A between the unit patterns of the photonic crystals 51, 52, and 53 is most preferable when it is ¼ to 2 times the wavelength of light. That is to say, if the distance A between the unit patterns of the photonic crystals 51, 52, and 53 is less than ¼ times the wavelength of light, this is inappropriate because light can be permeated or totally reflected. If the distance A between the unit patterns of the photonic crystals 51, 52, and 53 is over 2 times the wavelength of light, this is not preferable because the diffraction and scattering of light does not occur.

The representative length D of the unit patterns of the photonic crystals 51, 52, and 53 is most preferable when it is 0.1~0.5 times the distance A between the unit patterns of the photonic crystals 51, 52, and 53. That is to say, if the representative length D of the unit patterns of the photonic crystals 51, 52, and 53 is less than 0.1 times the distance A between the unit patterns of the photonic crystals 51, 52, and 53, this is inappropriate because the photonic crystal patterns are too small and thus light can be permeated and totally reflected without diffraction or scattering. If the representative length D of the unit patterns of the photonic crystals 51, 52, and 53 is over 0.5 times the distance A between the unit patterns of the photonic crystals 51, 52, and 53, this is not preferable because total reflection occurs.

Figure 4A:
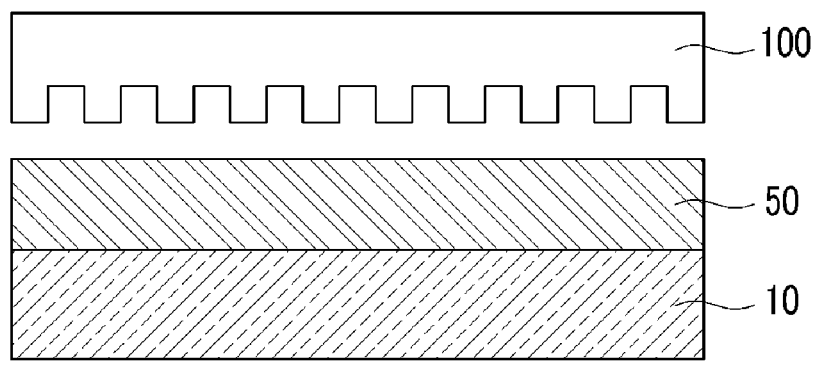
FIGS. 4A to 4C are cross sectional views showing the respective steps according to a first exemplary embodiment for forming a photonic crystal of the photonic crystal layer shown in FIG. 1 by a nanoimprint process.
Figure 4B:
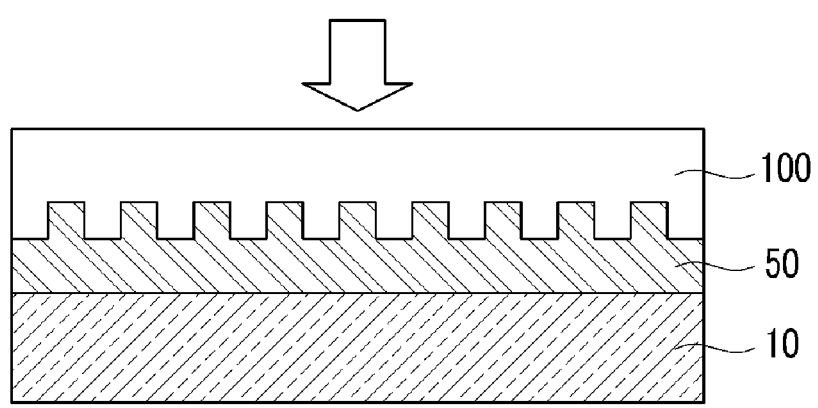

A manufacturing method of a photonic crystal layer using a nanoimprint process according to a first exemplary embodiment of the present invention will be described below with reference to FIGS. 4A to 4C.

First, a material of the photonic crystal layer 50 is coated on one surface of a substrate 10 by using a spin-coating and hardening process. As the material of the photonic crystal layer 50, a polymer is used. Then, a polymer resin is imprinted by heating and pressurizing by using a mask 100 having an inverted shape of a photonic crystal structure. Then, the photonic crystal structure of a nanometer size formed on the mask 100 can be easily transferred on the polymer resin, thereby forming a photonic crystal layer 50 having a photonic crystal structure.

Figure 5A:
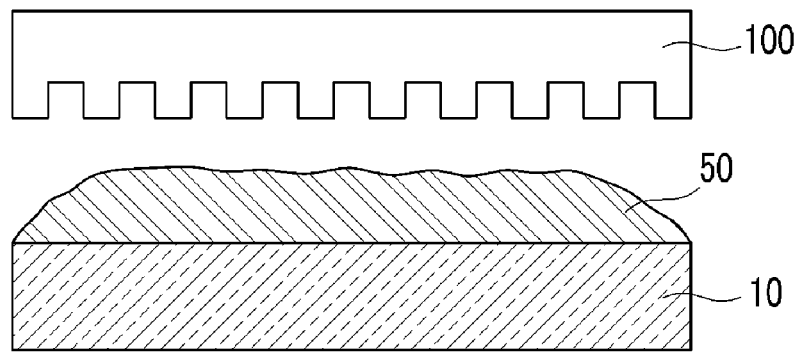
FIGS. 5A to 5C are cross sectional views showing the respective steps according to a second exemplary embodiment for forming a photonic crystal of the photonic crystal layer shown in FIG. 1 by a nanoimprint process.
Figure 5B:
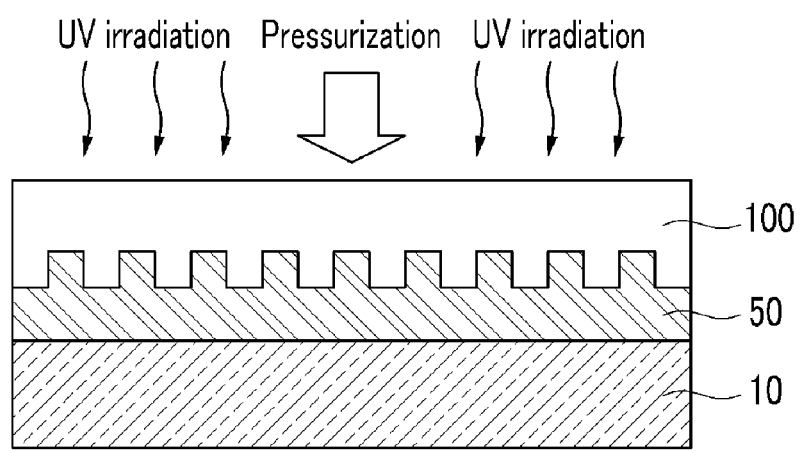
Figure 5C:
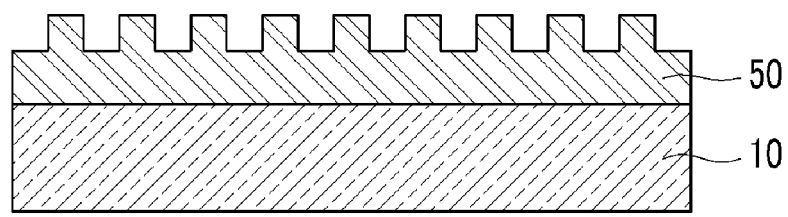

A manufacturing method of a photonic crystal layer using a nanoimprint process according to a second exemplary embodiment of the present invention will be described below with reference to FIGS. 5A to 5C.

Although the manufacturing method of a photonic crystal layer according to the second exemplary embodiment uses a nanoimprint process like the first exemplary embodiment, the method is slightly different from that of the first exemplary embodiment. First, a predetermined amount of polymer resin in liquid form is coated on one surface of a substrate 10 by use of a tool such as a pipette. Then, the polymer resin is pressurized by a mask 100 having an inverted shape of a photonic crystal structure. In addition, in a state that the polymer resin in liquid form is pressurized by the mask 100, the polymer resin is hardened by irradiating UV rays to the polymer resin or applying heat thereto. Then, the photonic crystal structure of a nanometer size formed on the mask 100 can be easily transferred on the polymer resin, thereby forming a photonic crystal layer 50 having a photonic crystal structure.

Figure 4C:
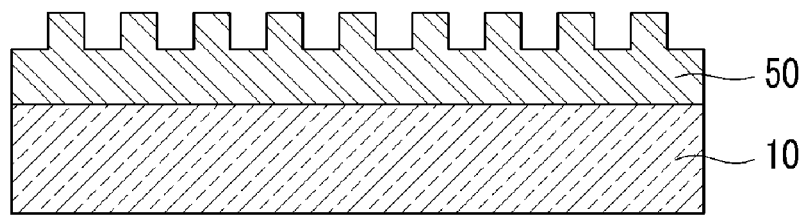
Figure 6A:
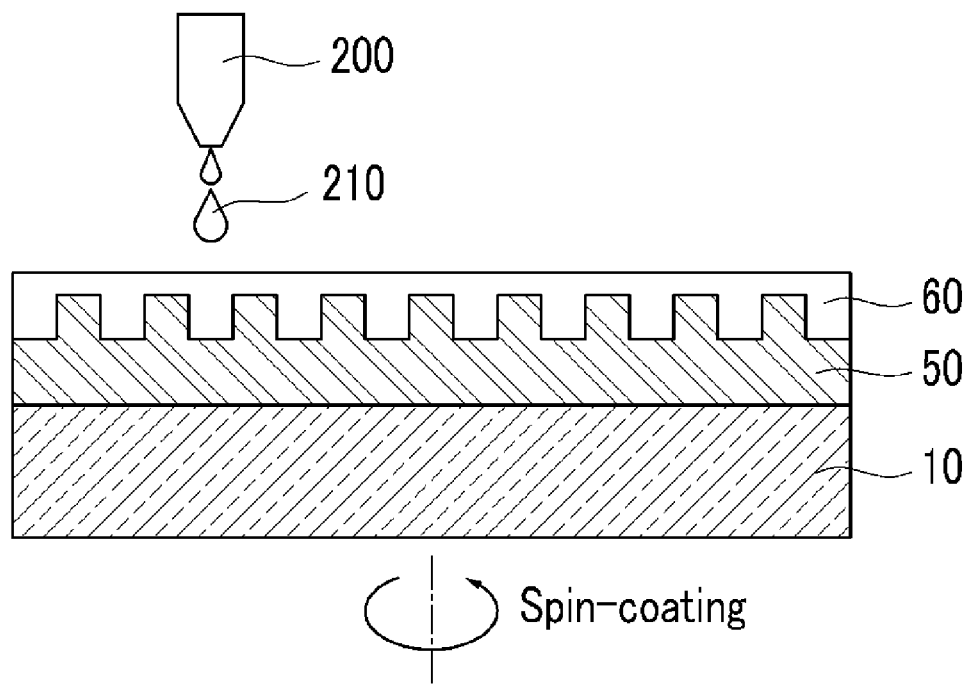
FIGS. 6A to 6B are cross sectional views showing the step of forming an intermediate layer on the photonic crystal layer shown in FIG. 4C by using a sol-gel method.
Figure 6B:
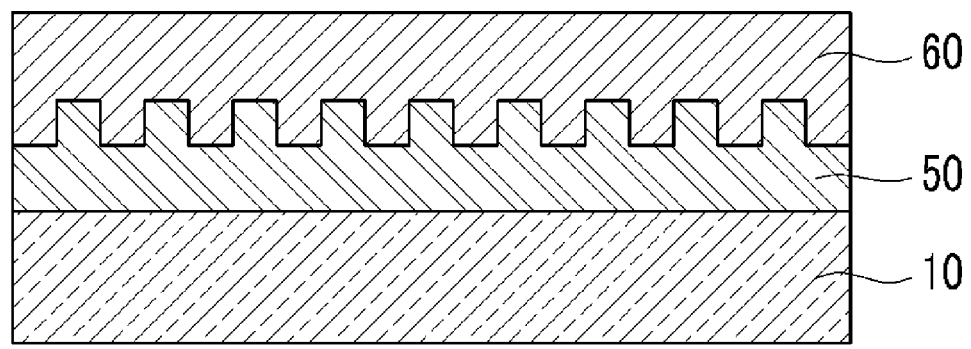

FIGS. 6A to 6B are cross sectional views showing the step of forming an intermediate layer on the photonic crystal layer shown in FIG. 4C by using a sol-gel method.

First, a sol-gel solution 210 is dropped onto a photonic crystal layer 50 by using a sol-gel injector 200. Next, the sol-gel solution 210 is spin-coated on the photonic crystal layer 50 by spinning a substrate 10 at 1,000-4,000 rpm. Next, an intermediate layer 60 is formed by inducing crystallization by heating the sol-gel solution 210. By repeating this process, an intermediate layer 60 having a set thickness.

Figure 7A:
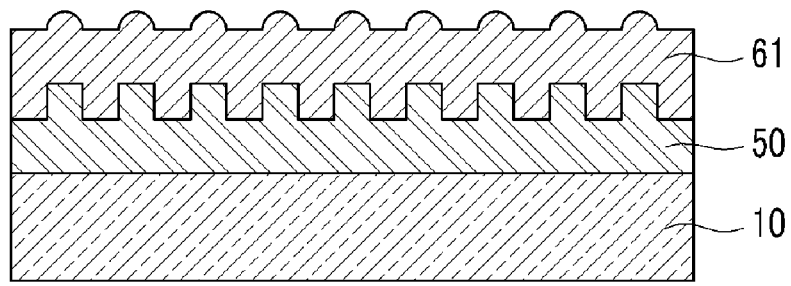
FIGS. 7A to 7C are cross sectional views showing the respective steps of forming an intermediate layer on the photonic crystal layer shown in FIG. 4C and then flattening the surface of the intermediate layer.
Figure 7B:
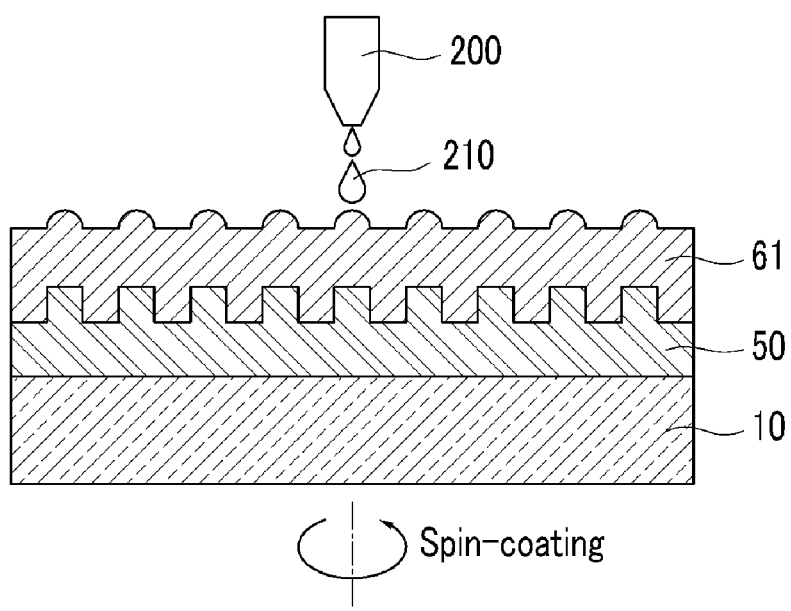
Figure 7C:
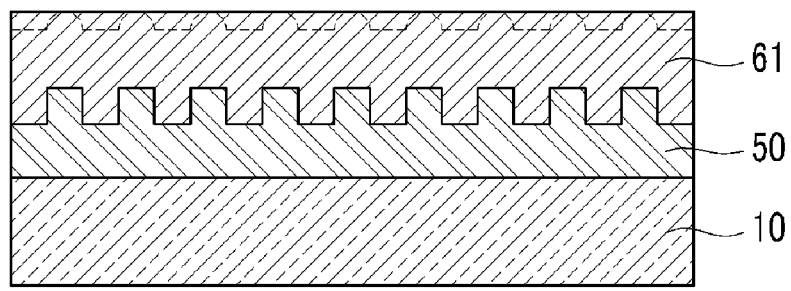

FIGS. 7A to 7C are cross sectional views showing the respective steps of forming an intermediate layer on the photonic crystal layer shown in FIG. 4C and then flattening the surface of the intermediate layer.

As shown in FIG. 7A, an intermediate layer 61 may be formed on the photonic crystal layer 50 by using methods, such as chemical vapor deposition (CVD), plasma enhanced chemical vapor deposition, evaporating deposition, sputtering, as well as the sol-gel method.

By the way, the surface of the intermediate layer 61 formed by these methods may not be even in a subtle way due to a recessed and convex photonic crystal structure formed on the photonic crystal layer 50. As mentioned above, the conductivity and electrical characteristics of the first electrode layer 20 is affected much by its surface shape, and hence it is not preferable to laminate the first electrode layer 20 on the intermediate layer 61 having an uneven surface.

Accordingly, it is necessary to flatten the surface of the intermediate layer 61 by using the sol-gel method. That is to say, the surface of the intermediate layer 61 can be flattened by filling a recessed portion 70 of the intermediate layer 61 with a sol-gel solution. In other words, the sol-gel solution 210 is dropped onto the surface of the intermediate layer 61 by using a sol-gel injector 200. Next, the sol-gel solution 210 is spin-coated on the intermediate layer 61 by spinning the substrate 10 at a high speed of 1,000-4,000 rpm. Next, an intermediate layer 61 having an even surface is formed by inducing crystallization by heating the sol-gel solution 210. The region filling the recessed portion 70 of the intermediate layer 61 is referred to as an even portion 72.

Figure 8A:
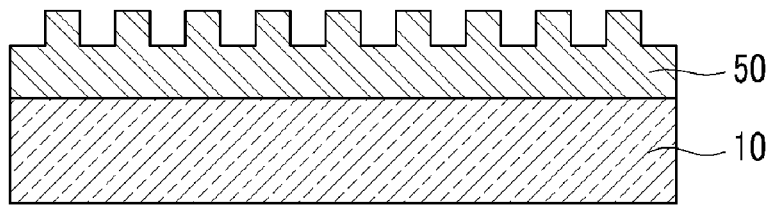
FIGS. 8A to 8C are cross sectional views showing the step of forming an intermediate layer after flattening the surface of the photonic crystal layer shown in FIG. 4C.
Figure 8B:
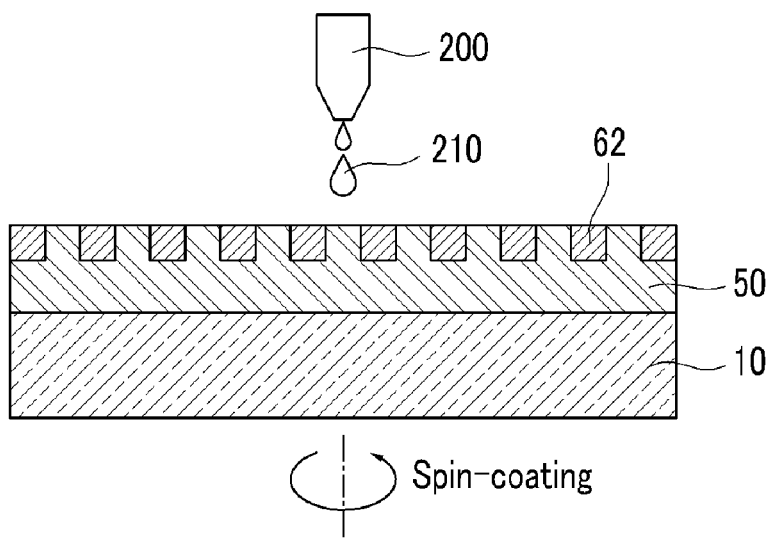
Figure 8C:
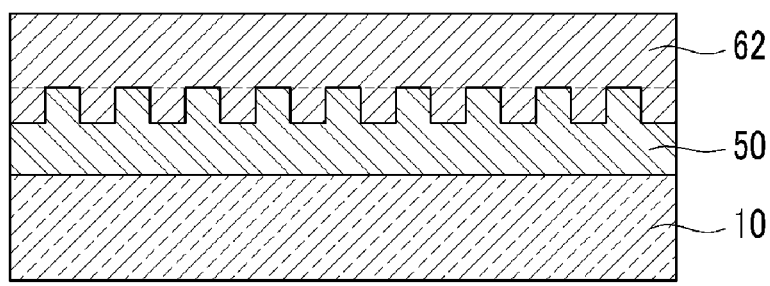

FIGS. 8A to 8C are cross sectional views showing the step of forming an intermediate layer after flattening the surface of the photonic crystal layer shown in FIG. 4C.

As shown in FIG. 8A, though the surface of the photonic crystal layer 50 is not even, the surface of the photonic crystal layer 50 can be flattened.

First, as shown in FIG. 8B, an intermediate layer 62 is formed. That is to say, a sol-gel solution 210 is dropped onto the photonic crystal layer 50, then the substrate 10 is spun at 1000-4000 rpm, and when the spaces on the photonic crystal structure are filled with the sol-gel solution 210, the surface of the photonic crystal layer 50 is flattened. Next, an intermediate layer 62 is additionally formed on the surface of the photonic crystal layer 50 according to any one of methods including chemical vapor deposition (CVD), plasma enhanced chemical vapor Deposition, evaporating deposition, and sputtering.

Figure 9:
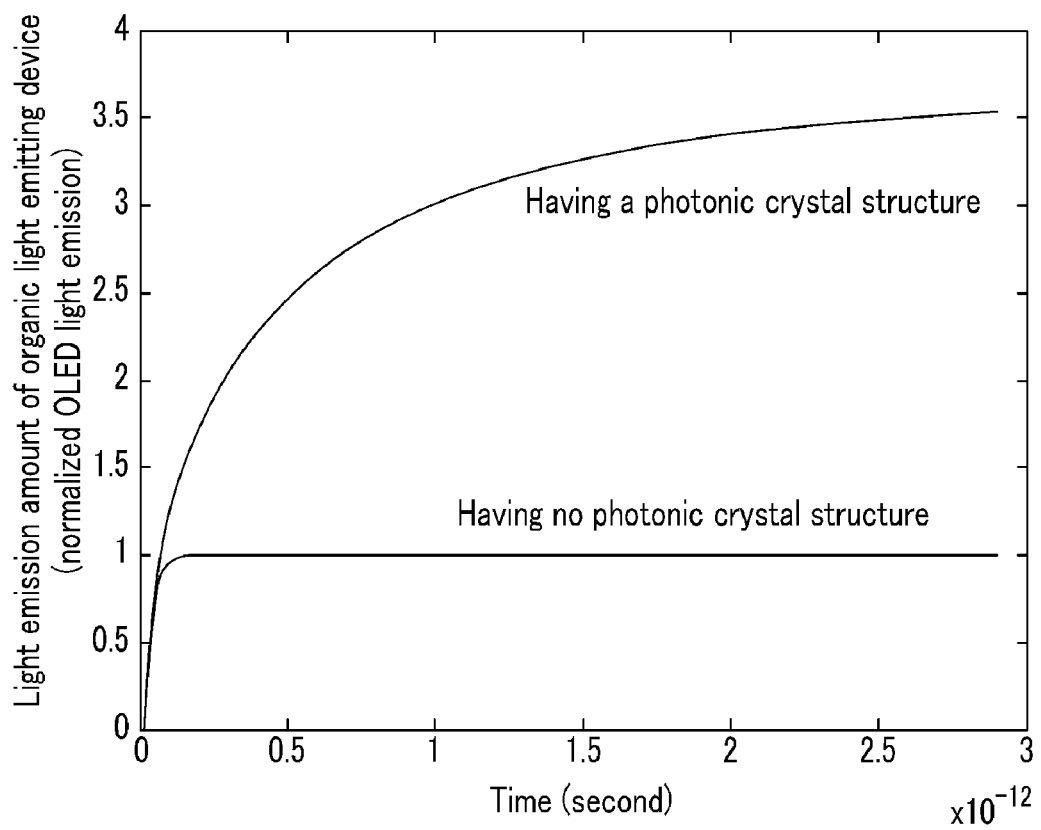
FIG. 9 and FIG. 10 are graphs comparatively illustrating the light emission amount of the organic light emitting device having a photonic crystal structure shown in FIG. 1 and the light emission amount of an organic light emitting device having no photonic crystal structure in the prior art, respectively, by simulation.
Figure 10:
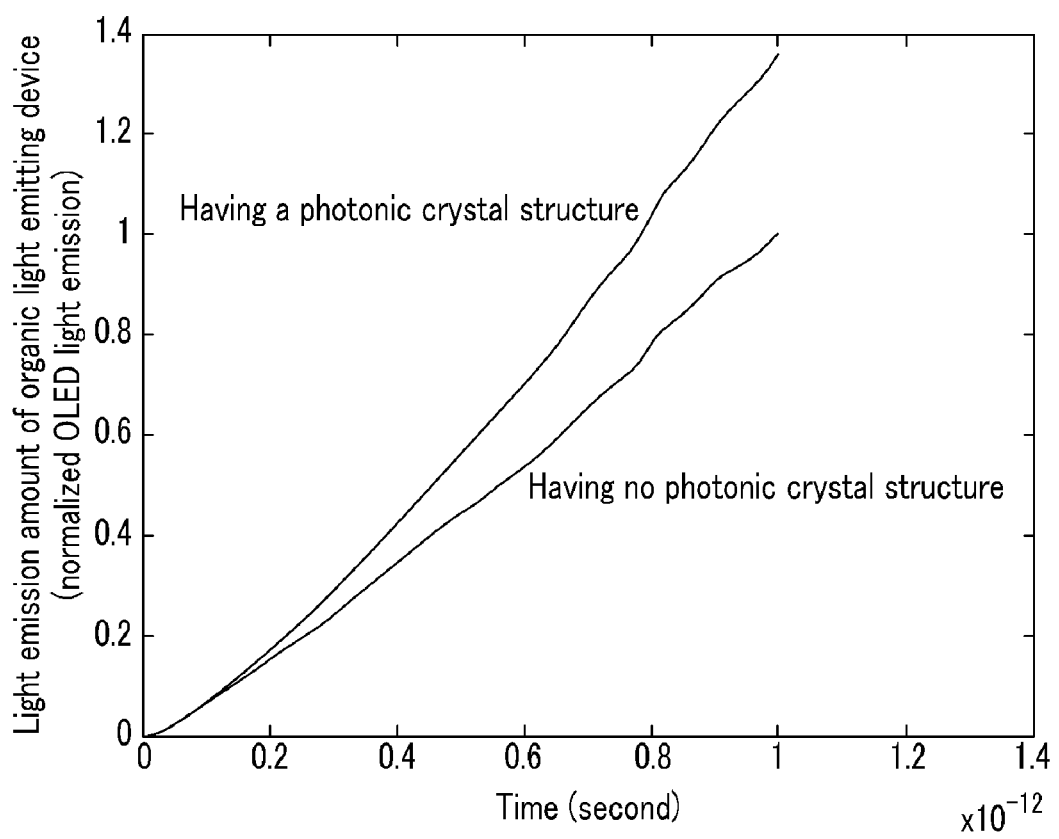

FIG. 9 and FIG. 10 are graphs comparatively illustrating the light emission amount of the organic light emitting device having a photonic crystal structure shown in FIG. 1 and the light emission amount of an organic light emitting device having no photonic crystal structure in the prior art, respectively, by simulation.

The graphs shown in FIGS. 9 and 10 are results of a simulation carried out by using an organic light emitting device whose light source wavelength is 511 nm and whose photonic crystal parameters are D=265 nm, A=530 nm and T=120 nm, respectively. Further, the graphs represent numerical values of an electromagnetic field by using an FDTD (Finite Difference Time Domain) method.

The graph shown in FIG. 9 is a result of a state in which a light source is operated by a pulse. The light source is adapted to be turned off at a certain point of time. Further, the light source is modeled as a dipole source having a polarization in a certain direction at a certain position in a similar way to an actual situation, and the polarization direction and phase are continuously changed at a certain point of time.

Referring to FIG. 9, the organic light emitting device having a photonic crystal structure continuously emits light even after the light source is turned off. Furthermore, the organic light emitting device having a photonic crystal structure showed improvement of optical efficiency by about 200% after two pico-seconds. On the other hand, the organic light emitting device having no photonic crystal structure has a smaller light emission amount than the organic light emitting device having a photonic crystal structure has, and there was not change in light emission amount after the light source disappears.

FIG. 10 is a result obtained under the same condition as the simulation condition of FIG. 9 except that the light source is adapted to continuously generate light. In this case, the organic light emitting device having a photonic crystal structure shows a larger light emission amount than the organic light emitting device having no photonic crystal structure does.

Figure 11:
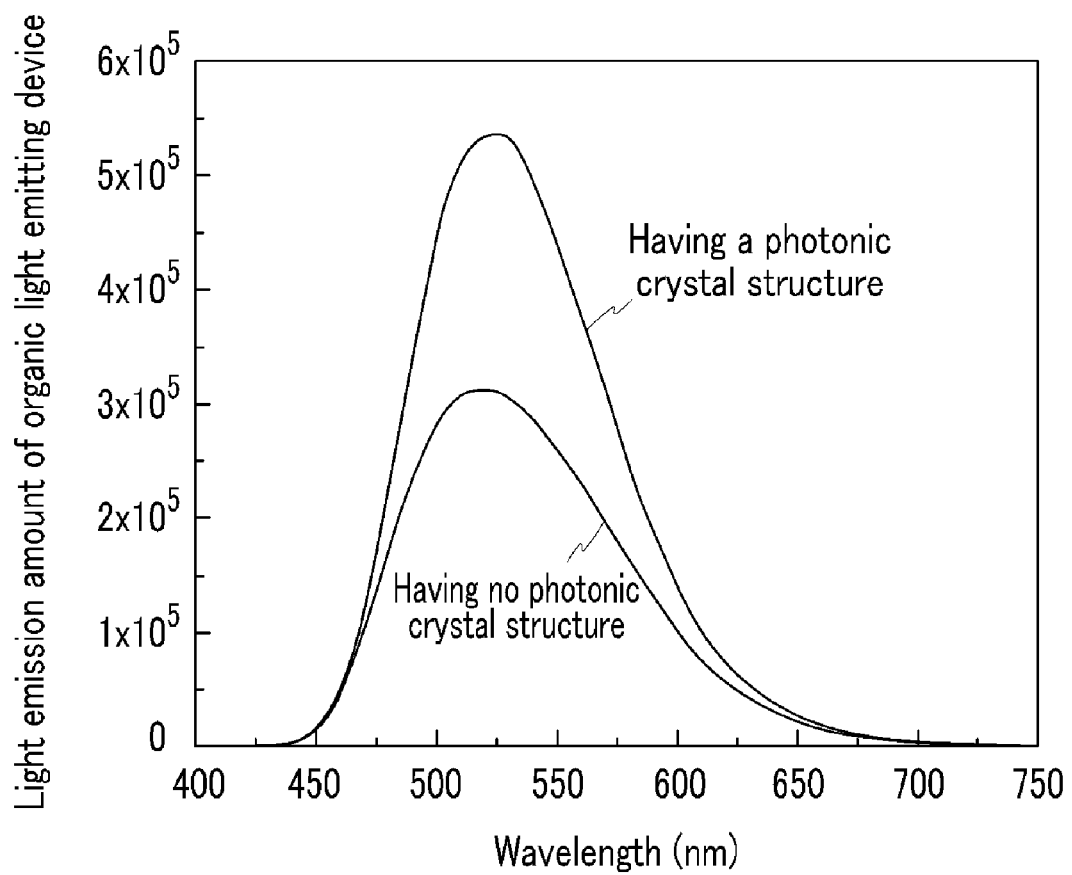
FIG. 11 is a graph showing light emission amounts according to wavelength using the organic light emitting device having a photonic crystal structure shown in FIG. 1 and the organic light emitting device having no photonic crystal structure.

FIG. 11 is a graph comparing light emission amounts according to wavelength by using the organic light emitting device having a photonic crystal structure shown in FIG. 1 and the organic light emitting device having no photonic crystal structure.

FIG. 11 is a result of examining a change in light emission amount according to wavelength of light by using the parameters of the organic light emitting device of FIG. 10. The organic light emitting device having a photonic crystal structure has a photonic crystal structure formed by a nanoimprint process, and is provided with an intermediate layer (made of $Si_3N_4$) having a thickness of 500 nm by plasma enhanced chemical vapor deposition. As a result, it can be seen that the light emission amount of the organic light emitting device having a photonic crystal structure is improved by up to about 50% though the light emission amount varies with the wavelength of light.

Figure 12:
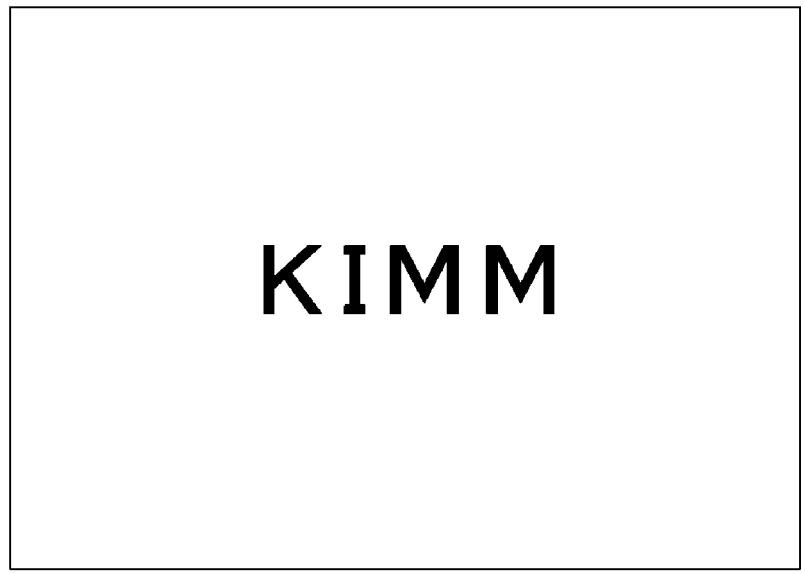
FIGS. 12 and 13 are views showing a character represented by using the organic light emitting device having a photonic crystal structure shown in FIG. 1.
Figure 13:
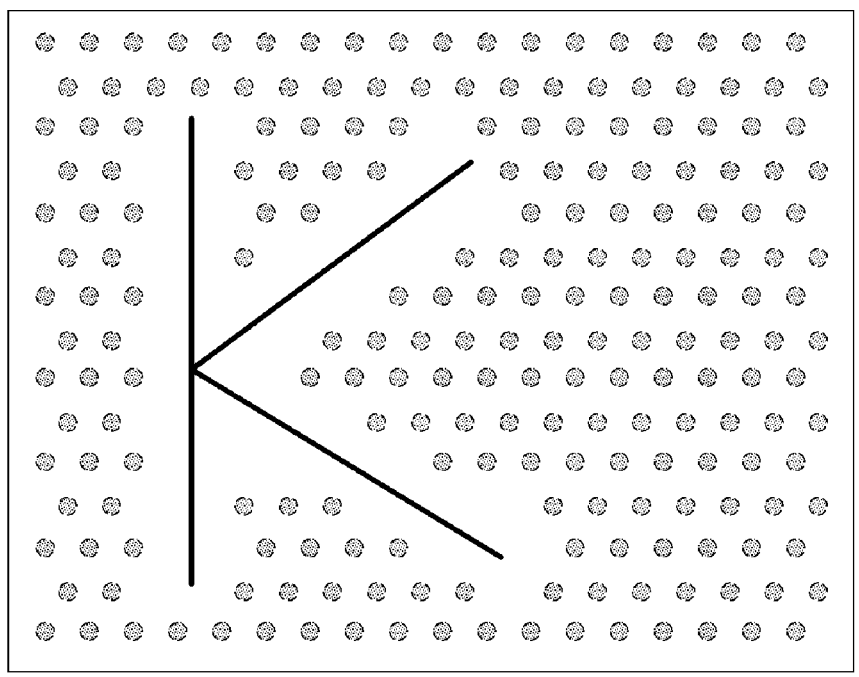

FIGS. 12 and 13 are views showing a character represented by using the organic light emitting device having a photonic crystal structure shown in FIG. 1.

As shown in FIGS. 12 and 13, the organic light emitting device according to the exemplary embodiments of the present invention makes light to be scattered and diffracted by having a photonic crystal structure. Accordingly, a character or picture is made noticeable by using the organic light emitting device according to the exemplary embodiments of the present invention, thereby improving visibility and representing a character or picture that emits a unique light. Subsequently, the organic light emitting device according to the exemplary embodiments of the present invention can be applied in a variety of display fields, such as advertising lighting requiring high visibility, as well as general lighting.

For instance, as shown in FIG. 12, when the parameters of the photonic crystal structure are set differently at a region where characters "KIMM" are positioned, the characters "KIMM" can be further noticeable.

In addition, as shown in FIG. 13, when the photonic crystal structure at a specific region is removed by etching or mechanical etching or mechanical removal, the specific region having no photonic crystal structure can be seen as a character "K".

In this manner, the organic light emitting device according to the exemplary embodiments of the present invention can be widely used as lighting which makes it easier to visually identify and produces a unique light.

Although the exemplary embodiments of the present invention have been described, the present invention is not limited thereto, and a variety of modifications can be made within the scope of the claims, the detailed description of the invention, and the attached drawings, which are also included in the present invention.

What is claimed is:

1. An organic light emitting device, comprising:
a substrate through which light passes;
a photonic crystal layer formed on the substrate and having a photonic crystal structure without voids therein;
an intermediate layer formed on the photonic crystal layer and having a refractive index that is greater than a refractive index of the photonic crystal layer;
a first electrode layer formed on the intermediate layer;
a light emitting layer formed on the first electrode layer and emitting light according to current flow; and
a second electrode layer formed on the light emitting layer,
wherein the photonic crystal layer is made of an ultraviolet (UV)-cured polymer resin and the substrate is a glass or sapphire substrate,
wherein the entire surface of the intermediate layer on which the first electrode layer is stacked is even.

2. The organic light emitting device of claim 1, wherein the refractive index of the photonic crystal layer is less than or equal to a refractive index of the substrate.

3. The organic light emitting device of claim 1, wherein the refractive index of the intermediate layer is greater than or equal to a refractive index of the first electrode.

4. The organic light emitting device of claim 3, wherein the intermediate layer is made of one material selected from the group consisting of oxides and nitrides.

5. The organic light emitting device of claim 3, wherein the intermediate layer is made of one or more materials selected from the group consisting of SiNx, $Si_3N_4$, $TiO_2$, MgO, ZnO, $Al_2O_3$, $SnO_2$ and $In_2O_3$.

6. The organic light emitting device of claim 1, wherein a sol-gel solution is coated on the intermediate layer.

7. The organic light emitting device of claim 1, wherein the photonic crystal structure forms a lattice structure by having a plurality of photonic crystal units regularly arranged thereon.

8. The organic light emitting device of claim 7, wherein the photonic crystal structure forms a square lattice structure by having a plurality of photonic crystal units regularly arranged thereon.

9. The organic light emitting device of claim 7, wherein the photonic crystal structure forms a triangular lattice structure by having a plurality of photonic crystal units regularly arranged thereon.

10. The organic light emitting device of claim 7, wherein a shape of the photonic crystal units is one of a cylinder, a trigonal pyramid, or a square pyramid.

11. The organic light emitting device of claim 1, wherein the first electrode layer is made of a transparent conducting oxide (TCO) material.

12. The organic light emitting device of claim 1, wherein the polymer resin, which is in a liquid form, is coated on one surface of the substrate to be cured by the UV.

* * * * *